United States Patent [19]

Reisfeld

[11] 4,246,545

[45] Jan. 20, 1981

[54] DATA SIGNAL RESPONSIVE PHASE LOCKED LOOP USING AVERAGING AND INITIALIZING TECHNIQUES

[75] Inventor: Frederick Reisfeld, Commack, N.Y.

[73] Assignee: Burroughs Corporation, Detroit, Mich.

[21] Appl. No.: 9,380

[22] Filed: Feb. 2, 1979

[51] Int. Cl.³ .............................................. H03L 7/08
[52] U.S. Cl. .................................... 331/1 A; 331/17; 331/25
[58] Field of Search ..................... 331/1 A, 17, 18, 25; 360/51

[56] References Cited

U.S. PATENT DOCUMENTS

| | | | |
|---|---|---|---|
| 3,594,655 | 7/1971 | Reisfeld | 331/18 X |
| 3,599,110 | 8/1971 | Gindi | 331/1 A X |
| 3,701,039 | 10/1972 | Lang et al. | 331/1 A |
| 4,003,086 | 1/1977 | Larsen et al. | 360/51 X |

Primary Examiner—Siegfried H. Grimm
Assistant Examiner—Edward P. Westin
Attorney, Agent, or Firm—Hane, Roberts, Spiecens & Cohen

[57] ABSTRACT

A phase-locked loop oscillator system includes a phase comparator in the form of a flip flop which is switched between states in response to received data pulses at one input and oscillator generated clocking pulses at another input. The positive and negative outputs of the flip-flop energize positive and negative constant current generators whose outputs feed in parallel a low pass filter or integrator including a capacitor which is initially discharged at the start of data reception by a field effect transistor connected in parallel with the capacitor. The output of the filter is a voltage whose amplitude is a measure of the phase difference between the sets of pulses. This voltage controls the amplitude of charging current fed to a sawtooth waveform generator to control the frequency thereof. The output of the generator is processed to form the clocking pulses for the system.

6 Claims, 2 Drawing Figures

DATA SIGNAL RESPONSIVE PHASE LOCKED LOOP USING AVERAGING AND INITIALIZING TECHNIQUES

BACKGROUND OF THE INVENTION

This invention pertains to oscillators and more particularly to phase-locked loop oscillators.

Phase-locked loop oscillators have many applications wherein a local oscillator must be synchronized to received signals. A common use is in the horizontal and vertical circuits of a television receiver. Another use is in the recovery of data.

In particular the recovery of data from computer peripheral equipment, such as a magnetic tape or disc, is generally implemented with a phase-locked loop system. Such a system provides for the separation of data and clocking information in an intermixed format.

Present day data formats such as modified frequency modulation, modified modified frequency modulation and group coded recording present additional requirements on the phase-locked loop system. Since these formats can omit one or more transitions, the time constant of the phase-locked loop must be sufficiently long so as not to be affected by these omitted transitions. In a situation where rapid successive read commands are issued by the controlling device, phase-lock loop recovery may not be possible in the time required.

PRIOR ART STATEMENT

A search of the prior art disclosed the following references:
U.S. Pat. No. 3,909,735 to Anderson et al;
U.S. Pat. No. 3,701,059 to Nyswander;
U.S. Pat. No. 3,689,903 to Agrewala et al;
U.S. Pat. No. 3,577,132 to Anderson et al;
U.S. Pat. No. 3,559,081 to Baudino et al;
U.S. Pat. No. 3,351,868 to Farrow; and
Cox et al, *IBM Tech. Discl. Bull.* Vol. 14 No. 4, Sept. 1971, p. 1222.

The Anderson et al patent discloses a phase-locked loop having a variable resistance connected to the output of a wide loop filter and a narrow loop filter. A switch circuit, responsive to a phase-lock condition, controls a variable resistance which causes the narrow loop filter to track the acquisition time of the wide loop filter.

The Nyswander patent discloses a low-pass R-C filter circuit having a FET switch as its input. The FET and a filter resistor provide the circuit filter resistance with the filter bandwidth controlled by the gate pulse width and frequency of the FET.

The Agrawala et al patent discloses a gated FET which controls signal flow through a low pass R-C filter in a phase-locked loop.

The Anderson et al patent discloses a phase-locked loop having an "integrating" means including an R-C filter. The capacitor of the filter is controllably charged and discharged by means of a transistor connected to the input of the filter.

The Baudino, Jr. et al patent discloses a filter network having an FET switch as an input to the filter. The FET switch acts to automatically switch the filter circuit as a function of the amplitude of the input signal. In order to accomplish rapid switching two filter capacitors are provided which are alternately charged in response to the FET switch.

The Farrow patent discloses a phase-locked loop having a transistor gate whose output controls the charging of a pair of capacitors in a low-pass R-C filter.

The Cox et al article discloses a phase-locked oscillator having a compensation network comprising a pair of series capacitors and a resistor connected to ground. An initialization pulse applied to two complementary input transistors causes another pair of transistors connected to the capacitors to saturate. The saturation of these transistors forces the capacitors to ground, thus causing them to discharge so that the initial synchronization time of the phase-locked oscillator is thus reduced.

SUMMARY OF THE INVENTION

Briefly the invention contemplates a phase-locked loop oscillator system for generating a train of signals having a repetition rate in synchronism with the repetition rate of received input signals. A phase comparator means has first and second inputs for receiving the generated train of signals and the input signals to generate a signal whose amplitude is related to the difference in the phase of the sets of signals. A low-pass filter means receives and filters the generated signals by a capacitor means which is discharged by a controlled switching means at the start of each operation. A voltage controlled oscillator receives the generated signal from the low-pass filter means and generates the train of signals with a frequency or repetition rate which is a function of the amplitude of such generated signal.

BRIEF DESCRIPTION OF THE DRAWING

The objects, features and advantages of the invention will be apparent from the following detailed description when read with the accompanying drawing which shows the presently preferred embodiment of the invention. In the drawing.

DESCRIPTION OF THE PREFERRED EMBODIMENT

Figure 1:
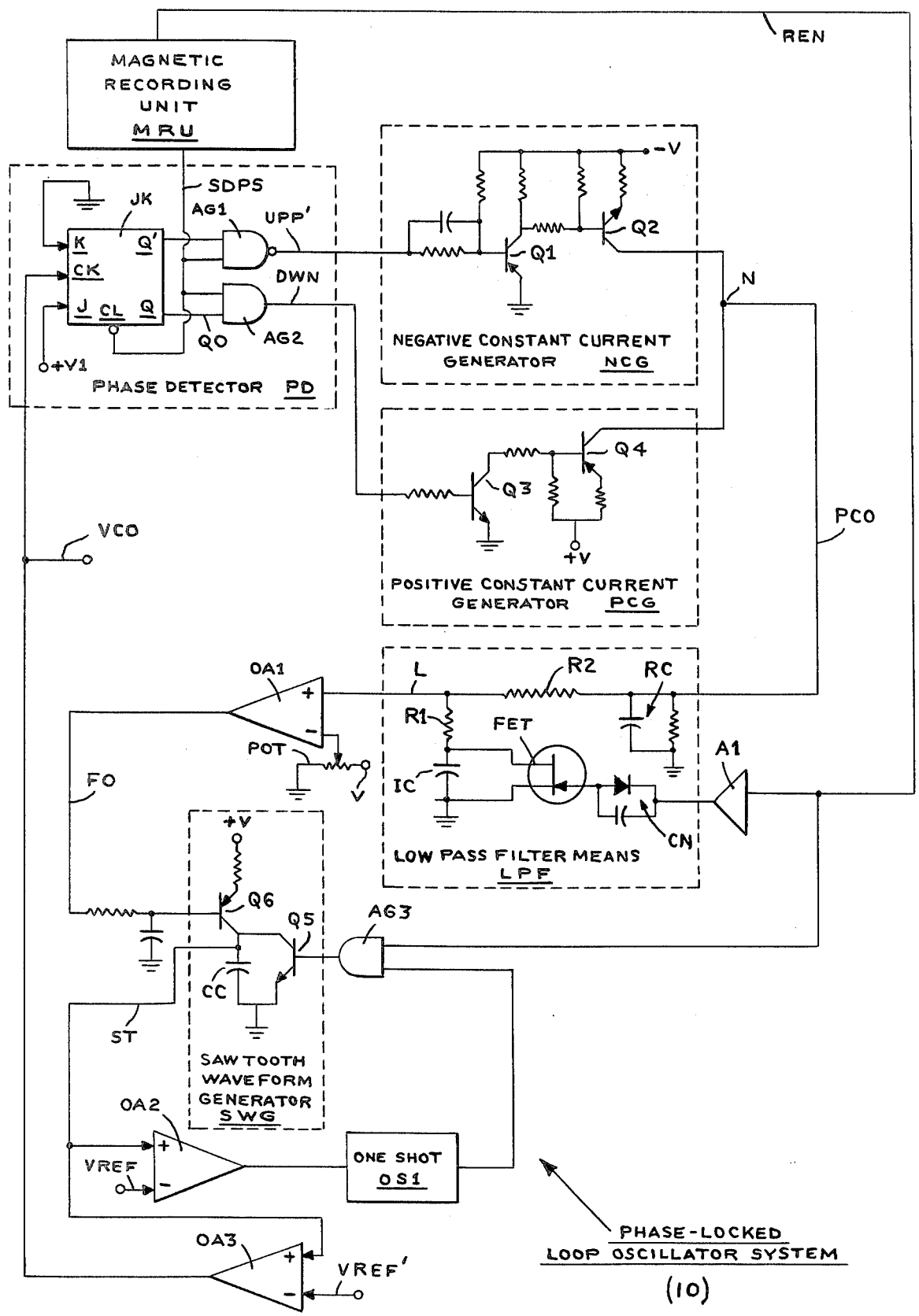
FIG. 1 shows a circuit diagram of the preferred embodiment of the invention.
Figure 2:
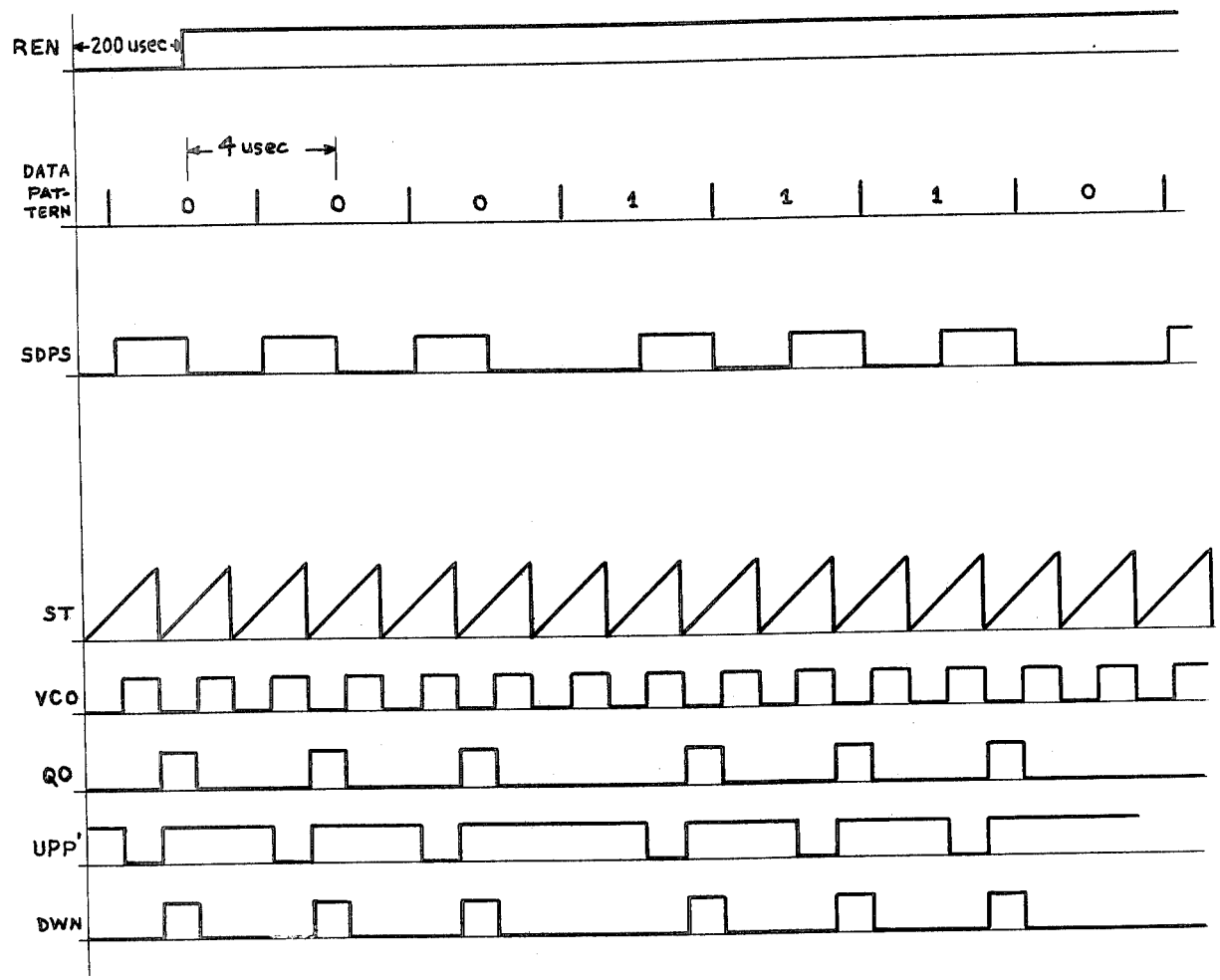
FIG. 2 is a waveform diagram which is useful in explaining the invention.

The circuit of FIG. 1 will be described with the aid of the waveform diagrams of FIG. 2. More specifically the phase-locked loop oscillator system shown in FIG. 1 comprises: the magnetic recording unit MRU which can include a floppy disk recording system upon which is recorded data in a NRZ format and circuitry for emitting pulses such as those on line SDPS for the data transitions. (The recording and reproducing techniques are not part of the invention); a phase comparator means including the phase detector PD, the negative constant current generator NCG and the positive constant current generator PCG; the low pass filter LPF including the integrating capacitor IC which can be discharged by the controlled switching device FET; and the voltage controlled oscillator including sawtooth waveform generator SWG.

In operation at the start of the transmission of data on line SDPS the magnetic recording unit MRU emits a signal on line REN which causes switching device FET to release the integrating capacitor IC from the initial state and allows the sawtooth waveform generator SWG to operate and feed a train of pulses on line VCO to one input of the phase detector PD which receives the data pulses on line SDPS. The outputs of the phase detector PD energize the constant current generators whose combined outputs are fed via line PCO to the low pass filter LPF which now integrates the positive and negative currents into a voltage whose amplitude is a function of the phase difference between the signals on lines VCO and SDPS. This voltage after being subtracted by a center frequency reference voltage in difference amplifier OA1 is fed to the sawtooth waveform generator SWG of the voltage controlled oscillator. The frequency of the output pulses therefrom is controlled by the amplitude of the input signal. The sawtooth waveform ST after processing by the difference amplifier OA3 can be used as a source of clocking pulse VCO for the system. It should be noted that prior to the transmission of each block of data the magnetic recording unit MRU emits a signal on line REN which is used to discharge the integrating capacitor IC.

The details of the various units will now be described. The phase detector PD of the phase comparator includes the JK-flip flop JK having a grounded K-input, a J-input set to a high voltage, a CK-input connected to line VCO, a CL-input connected to line SDPS, a Q'-output connected to one input of NAND-gate AG1, and a Q-output connected to one input of AND-gate AG2. The second input to each gate is connected to line SDPS. The output of NAND-gate AG1 is connected via line UPP' to the input of current generator NCG and the output of AND-gate AG2 is connected via line DWN to the input of current generator PCG. Negative constant current generator NCG centers around NPN-transistor Q2 having an emitter which is resistor connected to a negative potential −V, a collector connected to node N and a base connected via conventional driving transistor amplifier Q1 to line UPP'. Positive constant current generator PCG centers around PNP-transistor Q4 having an emitter which is resistor connected to positive potential +V, a collector connected to node N and a base connected via conventional driving transistor amplifier Q1.

In operation a signal on line SDPS will enable both of the gates AG1 and AG2 and also releases the flip-flop JK from its cleared state. Thus, the signal on line UPP' is low, the signal on line Q0 is low and the signal on line DWN is low (See FIG. 2). Consequently, negative constant generator NCG is turned on and current flows from line PCO through node N and transistor Q2 to potential −V. On the trailing edge of a pulse of line VCO flip-flop JK sets and since the pulse is present on line SDPS the signal on line UPP' goes high as does that on lines Q0 and DWN. Since the signal on line UPP' is now high, current generator NCG stops drawing current; but because line DWN is high positive, constant current generator PCG feeds current from potential source +V via transistor Q4 and mode N to line PCO. Thereafter when the pulse on line SDPS ends both gates are blocked. Thus the signal on line UPP' remains high and the signal on line DWN goes low and both current generators are inactive. The cycle again repeats at the start of the next pulse on line SDPS. In normal operation phase-lock results in equal width pulses on lines UPP' and DWN. Thus there is a zero net charge on filter LPF for each cycle. By virtue of the further circuitry the frequency of the pulses on line VCO will be reduced when the width of a pulse on line DWN is greater than the width of a pulse on line UPP' and vice versa.

The low-pass filter means LPF centers around capacitor IC having one grounded terminal and another terminal connected via a resistor R1 to line L which is connected via resistor R2 to line PCO. (The resistor-capacitor combination RC performs integration of the phase detector output.) The net current flow from node N is accumulated as a charge on capacitor IC with the amplitude and polarity of the charge representing the difference in phase (frequency) of the pulses on lines VCO and SDPS. To insure that at the start of each block of data, capacitor IC has zero net charge transistor FET of the field-effect type has its source and drain terminals connected across capacitor IC and its gate terminal connected via a leading edge shaping network CN and amplifier A1 to line REN. The capacitor IC is held discharged until the REN signal goes true. This permits the reduction of loop lock up time each time a read command is given.

The voltage across capacitor IC is fed to the positive input of difference amplifier OA1 whose negative input receives a reference voltage related to the nominal center frequency. These voltages are subtracted to produce an error voltage which is fed via line F0 to the voltage controlled oscillator.

In particular, the voltage is fed to the base of current controlling PNP transistor Q6 whose emitter is resistor coupled to potential +V and whose collector is coupled to charging capacitor CC. In effect transistor Q6 acts as a variable charging resistor for capacitor CC and thus controls its charging time. Capacitor CC is the timing capacitor for sawtooth waveform generator SWG while transistor Q5 is the discharging means for the capacitor by virtue of the emitter-collector path being in parallel therewith. In operation capacitor CC starts charging and a positive going ramp of the waveform on line ST is generated. When the ramp reaches a given amplitude (equal to the voltage at VREF) difference amplifier OA2 acting as a threshold device conducts and triggers one shot multivibrator OS1. The multivibrator OS1 emits a pulse which passes through AND-gate AG3 (the read enable signal is present on line REN) to the base of NPN transistor Q5 which momentarily conducts to discharge the capacitor and end the ramp cycle.

At the same time the signal on line ST is fed to the positive input of operation amplifier OA3 which in a sense operates as a Schmitt-trigger to turn on when the voltage at the positive input exceeds a given value and to turn off when such signal thereafter drops below that value. The output of amplifier OA3 is the signal on line VCO which can be used for determining the clocking pulses for the system. In particular, when amplifier OA3 is biased such that $VREF' = \frac{1}{2} VREF$ its output when receiving a linear ramp signal at its input emits a square wave.

While only one embodiment has been shown and described in detail there will now be obvious to those skilled in the art many modifications and variations that satisfy many or all of the objects of the invention without departing from the spirit thereof as indicated by the appended claims.

I claim:

1. A phase-locked oscillator system for generating a train of signals having a repetition rate in synchronism with the repetition rate of a train of received input signals comprising: means for generating a start signal at the beginning of the train of received input signals, a phase comparator means having a first input for receiving the train of received input signals and a second input for receiving a train of pulses, and an output for generating a signal whose amplitude is directly related to the difference in phase between signals simultaneously received at the first and second inputs; a low pass filter means having an input connected to the output of said phase comparator means and output for transmitting low pass filtered signals, said low pass filter means including a capacitor connected between the input thereof and a reference potential; controlled switching means receiving said start signal for discharging said capacitor only at the start of the reception of the train of received input signals; and a voltage controlled oscillator means having an input connected to the output of said low pass filter means and an output connected to the second input of said phase comparator means for generating a train of signals having a repetition rate which is a function of the amplitude of the signal received from said low pass filter means.

2. The oscillator of claim 1 wherein said controlled switching means comprises a field effect transistor having source and drain electrodes connected to the respective terminals of said capacitor means and a gate terminal for receiving a signal before the start of the received input signals.

3. The oscillator of claims 1 or 2 wherein said voltage controlled oscillator means comprises a free running sawtooth waveform generator whose frequency is controlled by the amplitude of the signal received from said low pass filter means.

4. The oscillator of claim 3 wherein said voltage controlled oscillator means comprises a transistor having a common terminal connected to the reference potential, an input terminal and an output terminal, a charging capacitor connected between said common and output terminals, a controlled current generator means connected to said output terminal and having a control input connected to the output of said low pass filter means for generating a current whose amplitude is a function of the amplitude of the signal from said low pass filter means, pulse generating means connected to said output terminal for generating a control pulse each time the amplitude of the signal at said output terminal exceeds a predetermined value, means connecting the pulse generating means to the input terminal of said transistor for switching said transistor to the conductive state each time a control pulse is received.

5. The oscillator of claim 2 wherein said phase comparator means comprises phase detector means including a bistable means having first and second input terminals which are respectively the first and second inputs of said phase comparator means and first and second output terminals, a first constant current generator means connected to said first output terminal for emitting a first polarity current from an output thereof whenever a signal is present at the first output terminal of said bistable means, a second constant current generator means connected to said second output terminal for emitting a second polarity current from an output thereof whenever a signal is present at the second output terminal of said bistable means, and means connecting the outputs of said constant current generator means in parallel to the input of said low pass filter means.

6. The oscillator of claim 4 wherein said phase comparator means comprise phase detector means including a bistable means having first and second input terminals which are respectively the first and second inputs of said phase comparator means and first and second output terminals, a first constant current generator means connected to said first output terminal for emitting a first polarity current from an output thereof whenever a signal is present at the first output terminal of said bistable means, a second constant current generator means connected to said second output terminal for emitting a second polarity current from an output thereof whenever a signal is present at the second output terminal of said bistable means, and means connecting the outputs of said constant current generator means in parallel to the input of said low pass filter means.

* * * * *